United States Patent
Yasui et al.

(10) Patent No.: US 11,385,304 B2
(45) Date of Patent: Jul. 12, 2022

(54) MAGNETIC FIELD MEASURING APPARATUS AND FLUX QUANTUM CALCULATING METHOD

(71) Applicants: Ricoh Company, Ltd., Tokyo (JP); KANAZAWA INSTITUTE OF TECHNOLOGY, Ishikawa (JP)

(72) Inventors: Takashi Yasui, Tokyo (JP); Daisuke Oyama, Ishikawa (JP)

(73) Assignees: Ricoh Company, Ltd., Tokyo (JP); KANAZAWA INSTITUTE OF TECHNOLOGY, Ishikawa (JP)

( * ) Notice: Subject to any disclaimer, the term of this patent is extended or adjusted under 35 U.S.C. 154(b) by 157 days.

(21) Appl. No.: 17/062,749

(22) Filed: Oct. 5, 2020

(65) Prior Publication Data

US 2021/0103012 A1    Apr. 8, 2021

(30) Foreign Application Priority Data

Oct. 8, 2019 (JP) .............................. JP2019-185270
Sep. 23, 2020 (JP) .............................. JP2020-158822

(51) Int. Cl.
*G01R 33/02* (2006.01)
*G01R 33/035* (2006.01)
(Continued)

(52) U.S. Cl.
CPC ...... *G01R 33/0356* (2013.01); *G01R 33/0023* (2013.01); *G01R 33/0029* (2013.01);
(Continued)

(58) Field of Classification Search
CPC ...... H03M 1/12; H03M 1/66; G01R 33/0356; G01R 33/0354; G01R 33/0023; G01R 33/0058; G01R 33/0041; G01R 33/0029
See application file for complete search history.

(56) References Cited

U.S. PATENT DOCUMENTS

| 7,248,044 B2 | 7/2007 | Kobayashi et al. |
| 2006/0095220 A1 | 5/2006 | Vrba et al. |
| 2007/0114994 A1* | 5/2007 | Kobayashi ......... G01R 33/0354 324/248 |

FOREIGN PATENT DOCUMENTS

| JP | 4133934 | 8/2008 |
| JP | 2020-153816 | 9/2020 |
| WO | 2020/189643 | 9/2020 |

OTHER PUBLICATIONS

Extended European Search Report for 20200622.7 dated Mar. 4, 2021.

* cited by examiner

*Primary Examiner* — Joseph J Lauture
(74) *Attorney, Agent, or Firm* — IPUSA, PLLC

(57) ABSTRACT

A magnetic field measuring apparatus includes a digital FLL circuit including ADC that converts a periodically changing voltage output from a SQUID according to a change in a magnetic field into a digital value, a digital integrator that integrates the digital value output from the ADC, a DAC that converts an integrated value output from the digital integrator into a voltage, a converter that converts the voltage output from the DAC into a current, and a coil that generates the magnetic field received by the SQUID, based on the current output from the converter. A calculating device calculates a digital value indicating a flux quantum based on the digital value output from the ADC when the ADC converts the periodically changing voltage output from the SQUID upon receiving the magnetic field generated by a current that is obtained by converting a voltage generated by a voltage generator.

20 Claims, 6 Drawing Sheets

(51) Int. Cl.
*H03M 1/12* (2006.01)
*H03M 1/66* (2006.01)
*G01R 33/00* (2006.01)

(52) U.S. Cl.
CPC ...... *G01R 33/0041* (2013.01); *G01R 33/0058* (2013.01); *G01R 33/0354* (2013.01); *H03M 1/12* (2013.01); *H03M 1/66* (2013.01)

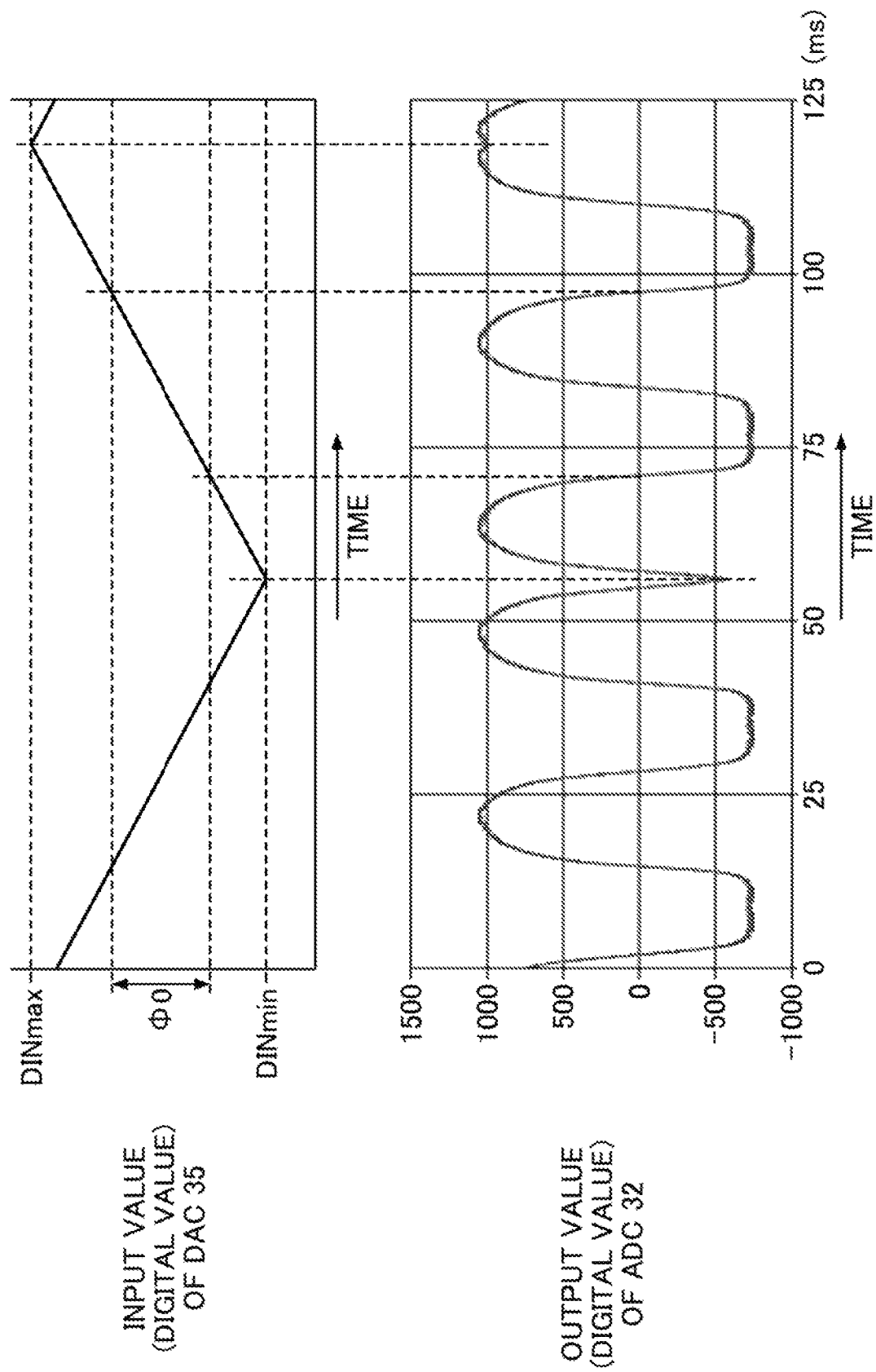

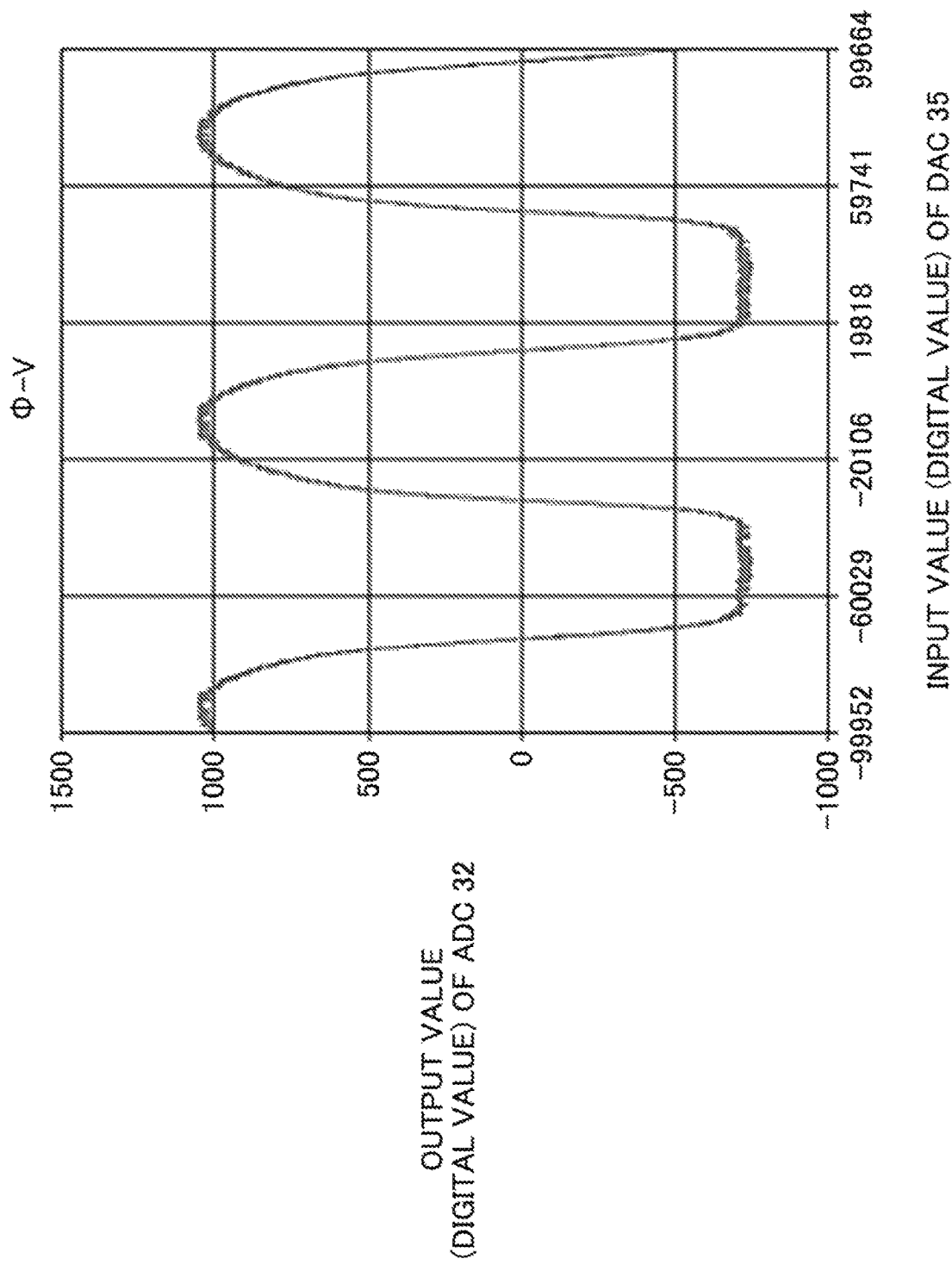

MAGNETIC FIELD MEASURING APPARATUS AND FLUX QUANTUM CALCULATING METHOD

CROSS REFERENCE TO RELATED APPLICATIONS

The present application is based upon and claims priority to Japanese Patent Application No. 2019-185270, filed on Oct. 8, 2019, and Japanese Patent Application No. 2020-158822, filed on Sep. 23, 2020, the entire contents of which are incorporated herein by reference.

BACKGROUND OF THE INVENTION

1. Field of the Invention

The present disclosure relates to a magnetic field measuring apparatus and a flux quantum (or fluxoid) calculating method.

2. Description of the Related Art

In biomagnetic field measurements using a superconducting quantum interference device (SQUID) that is a superconductor ring having a Josephson junction, the measurement characteristics are nonlinear. For this reason, a linearization is performed using a fluxed locked loop (FLL) circuit, to measure the magnetic field. In the following description, the superconducting quantum interference device may also be simply referred to as the SQUID.

There are two types of FLL circuits, namely, an analog FLL type that is formed solely of analog circuits, and a digital FLL type that is formed of circuits that perform an analog-to-digital conversion and then a digital-to-analog conversion. Because multiple channels are generally used for the biomagnetic field measurements, the digital FLL type is more popularly used from a viewpoint of the ease of reducing variation among the channels, reducing system cost, and data processing, and also from a viewpoint of progress made in semiconductor technology.

In a magnetic field measuring apparatus including the SQUID and the digital FLL circuit, a method of reducing the cost, using a counter that counts the number of periods of the flux quantum, and another counter that counts the frequency with respect to the flux to be measured, is described in Japanese Unexamined Patent Application Publication No. 2005-345289 (now Japanese Patent No. 4133934), for example.

In order to accurately measure the amount of change (hereinafter also referred to as "variation") in magnetic flux using the digital FLL circuit, it is necessary to accurately detect the flux quantum that varies periodically with respect to the change in magnetic flux. For example, the periodic change in the flux quantum is indicated by an amount of change of an output value of an analog-to-digital converter implemented in the digital FLL circuit to convert a voltage from the SQUID into a digital value. This amount of change of the output value of the analog-to-digital converter is not constant due to the variation in the electrical characteristics of the SQUID and the variation in the electrical characteristics of the circuits from the SQUID to the analog-to-digital converter. For this reason, it is difficult to improve the measurement accuracy of the magnetic field measuring apparatus.

SUMMARY

Accordingly, one object of the embodiments is to provide a magnetic field measuring apparatus and a flux quantum calculating method, capable of accurately measuring the flux quantum.

According to one aspect of the embodiments, a magnetic field measuring apparatus includes a digital flux locked loop circuit including a first analog-to-digital converter configured to convert a periodically changing voltage, output from a superconducting quantum interference device according to a change in a magnetic field, into a digital value, a digital integrator configured to integrate the digital value output from the first analog-to-digital converter, a digital-to-analog converter configured to convert an integrated value output from the digital integrator into a voltage, a first voltage-to-current converter configured to convert the voltage output from the digital-to-analog converter into a current, and a first coil configured to generate the magnetic field received by the superconducting quantum interference device, based on the current output from the first voltage-to-current converter; and a calculating device configured to calculate a digital value indicating a flux quantum based on the digital value output from the first analog-to-digital converter when the first analog-to-digital converter converts the periodically changing voltage output from the superconducting quantum interference device upon receiving the magnetic field generated by a current that is obtained by converting a voltage generated by a voltage generator.

According to another aspect of the embodiments, a flux quantum calculating method for calculating a flux quantum using a magnetic field measuring apparatus that includes a digital flux locked loop circuit, includes converting, by a first analog-to-digital converter included in the digital flux locked loop circuit, a periodically changing voltage, output from a superconducting quantum interference device according to a change in a magnetic field, into a digital value; integrating, by a digital integrator included in the digital flux locked loop circuit, the digital value output from the first analog-to-digital converter, into an integrated value; converting, by a first voltage-to-current converter included in the digital flux locked loop circuit, the integrated value output from the digital integrator, into a current; generating, by a first coil included in the digital flux locked loop circuit, the magnetic field received by the superconducting quantum interference device, based on the current output from the first voltage-to-current converter; and calculating, by a calculating device included in the magnetic field measuring apparatus, a digital value indicating a flux quantum based on the digital value output from the first analog-to-digital converter when the first analog-to-digital converter converts the periodically changing voltage output from the superconducting quantum interference device upon receiving the magnetic field generated by a current that is obtained by converting a voltage generated by a voltage generator.

Other objects and further features of the present invention will be apparent from the following detailed description when read in conjunction with the accompanying drawings.

BRIEF DESCRIPTION OF THE DRAWINGS

FIG. 2A is a diagram for explaining an example in which a flux quantum $\Phi 0$ is measured by the magnetic field measuring apparatus illustrated in FIG. 1.

FIG. 2B is a diagram for explaining an example in which the flux quantum Φ0 is measured by the magnetic field measuring apparatus illustrated in FIG. 1.

DESCRIPTION OF THE EMBODIMENTS

Figure 1:
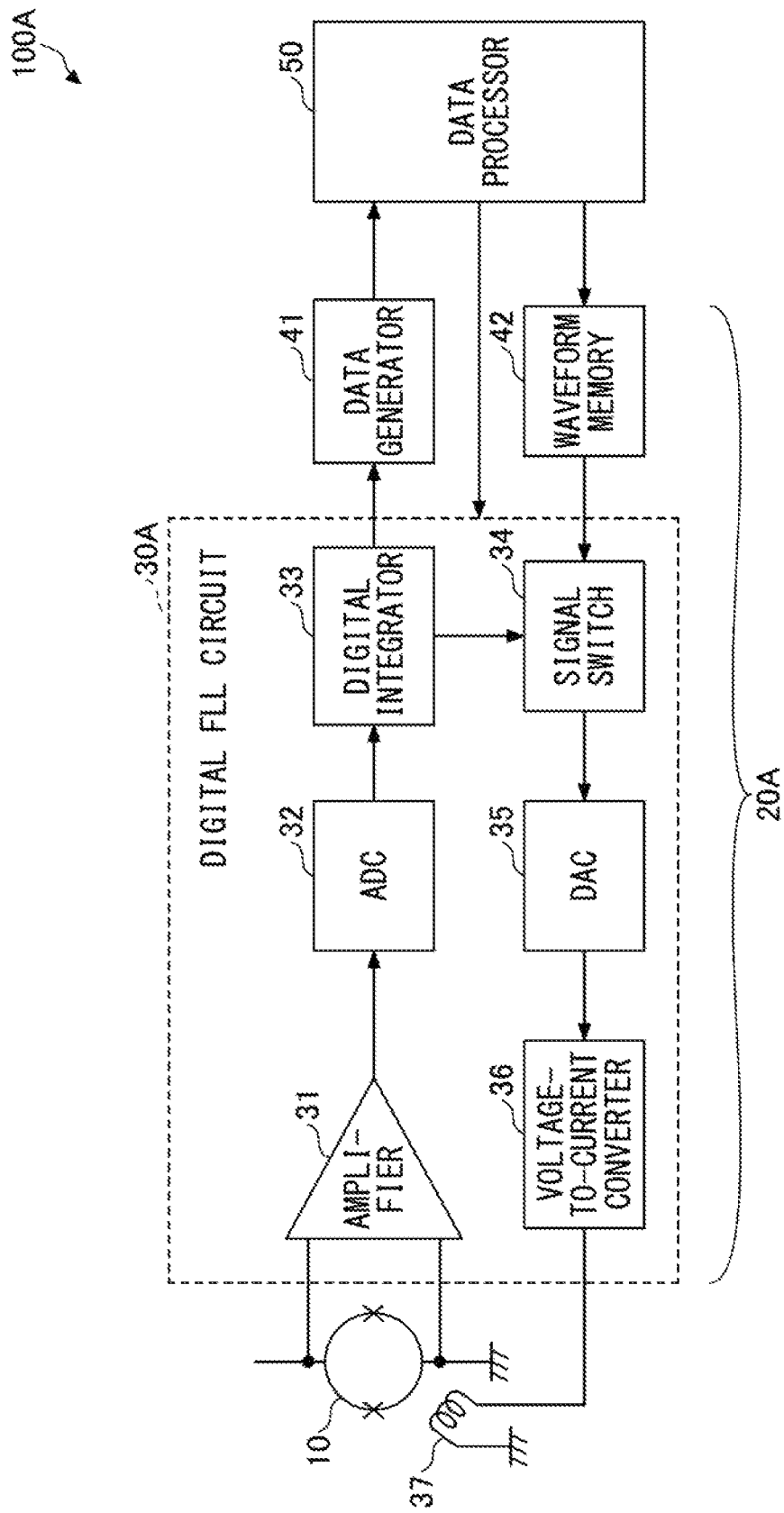
FIG. 1 is a block diagram illustrating an example of a magnetic field measuring apparatus according to a first embodiment of the present invention.

Embodiments will hereinafter be described with reference to the drawings. In drawings, the same constituent elements are designated by the same reference numerals, and a repeated description of the same constituent elements may be omitted.

As described above, the amount of change of the output value of the analog-to-digital converter implemented in the digital flux locked loop (FLL) circuit to convert the voltage from the SQUID into the digital value, is not constant due to the variation in the electrical characteristics of the SQUID and the variation in the electrical characteristics of the circuits from the SQUID to the analog-to-digital converter. Hence, it is difficult to improve the measurement accuracy of the magnetic field measuring apparatus. In order to improve the measurement accuracy of the magnetic field measuring apparatus, it may be preferable to measure the flux quantum for each digital FLL circuit.

First Embodiment

FIG. 1 is a block diagram illustrating an example of a magnetic field measuring apparatus according to a first embodiment of the present invention. For example, a magnetic field measuring apparatus 100A illustrated in FIG. 1 employs the digital FLL circuit, and may be applied to a magnetoencephalograph (MEG), a magnetospinograph (MSG), a magnetocardiograph (MCG), or the like, for example. Further, the magnetic field measuring apparatus 100A illustrated in FIG. 1 may be applied to a magneto-myograph (MMG), for example.

The magnetic field measuring apparatus 100A includes a SQUID 10, a SQUID sensor circuit 20A, a feedback coil 37, and a data processor 50. The SQUID 10 is a high-sensitivity magnetic sensor that detects a magnetic field (or magnetic flux) generated from a living body and passing through a superconductor ring (or superconducting ring) having a Josephson junction. For example, the SQUID 10 is formed by providing the Josephson junction at two locations on the superconductor ring.

The SQUID 10 generates a voltage that changes periodically with respect to a change in magnetic flux passing through the superconductor ring. For this reason, it is possible to obtain the magnetic flux passing through the superconductor ring, by measuring the voltage at both ends of the superconductor ring in a state where a bias current is applied to the superconductor ring. In the following description, a characteristic of the periodic voltage variation generated by the SQUID 10 is also referred to as a Φ-V characteristic, and one period of the periotic voltage variation generated by the SQUID 10 is also referred to as a flux quantum Φ0.

The SQUID sensor circuit 20A includes a digital flux locked loop (FLL) circuit 30A that processes a magnetic field signal detected by the SQUID 10, a data generator 41, and a waveform memory 42. The digital FLL circuit 30A includes an amplifier 31, an analog-to-digital converter (ADC) 32, a digital integrator 33, a signal switch 34, a digital-to-analog converter (DAC) 35, and a voltage-to-current converter 36. A feedback coil 37 arranged adjacent to the SQUID 10 is physically separated from the digital FLL circuit 30A, but may be included in a functional block of the digital FLL circuit 30A.

The amplifier 31 amplifies the output voltage generated by the SQUID 10 due to the magnetic flux passing through the SQUID 10, and outputs the amplified output voltage to the ADC 32. The ADC 32 converts the analog signal from the amplifier 31 into a digital signal (or voltage value) by sampling the analog signal at a predetermined sampling frequency. In other words, the ADC 32 converts the voltage output from the SQUID 10 into a digital value, according to a change in the magnetic field. The ADC 32 outputs the digital value generated by the conversion to the digital integrator 33.

The digital integrator 33 includes a counter, and counts the number of periodic changes in the φ-V characteristic of the SQUID 10 (that is, the repetitions of the flux quantum Φ0), based on the voltage value (or digital value) output from the ADC 32. In addition, the digital integrator 33 integrates the amount of change in the voltage of the SQUID 10 (to be more accurate, the amplified voltage output from the amplifier 31) from a working point (or locking point) that is the origin of counting (or measuring) the flux quantum Φ0, and outputs the integrated voltage value to the DAC 35 via the signal switch 34. The integrated voltage value is reset for every flux quantum Φ0, and a counted value of the counter is updated.

The above described operation of the digital integrator 33 is an operation during a normal measurement mode for measuring the biomagnetic field or the like of a test subject. The digital integrator 33 does not perform an integration operation, and operates as a buffer, during a Φ0 evaluation mode for measuring the flux quantum Φ0.

The flux quantum Φ0 (one period of the output voltage of the SQUID 10) may also be expressed as the amount of change in the voltage input to the ADC 32, and may also be expressed as the amount of change in the digital value output from the ADC 32 according to the voltage change.

The digital integrator 33 outputs the integrated voltage value and the counted value to the data generator 41. The data generator 41 generates digital data from the magnetic field signal output from the digital integrator 33, and outputs the generated digital data to the data processor 50, such as a personal computer, a server, or the like.

For example, the data processor 50 stores the digital data generated by the data generator 41 in a storage device (not illustrated), generates image data using the digital data stored in the storage device, and displays an image indicated by the generated image data on a display or a display device (not illustrated). In addition, the data processor 50 stores signal waveform data used for measuring the flux quantum Φ0 in the waveform memory 42, prior to the measurement in the Φ0 evaluation mode.

Moreover, in the Φ0 evaluation mode, the data processor 50 calculates the digital value (the amount of change in the digital value) corresponding to the flux quantum Φ0, based on the digital value output from the digital integrator 33 via the data generator 41. A method of calculating the digital value indicating the flux quantum Φ0 will be described in conjunction with FIG. 2A and FIG. 2B. The data processor 50 is an example of a calculating device configured to calculate (or a computing device configured to compute) the digital value indicating the flux quantum Φ0.

The data processor 50 may receive an instruction from an operator of the magnetic field measuring apparatus 100A through an input device (not illustrated), and control the operation of the SQUID sensor circuit 20A to perform the measurement of the biomagnetic field or the like of the test subject, based on the received instruction.

The waveform memory 42 stores the signal waveform data transferred from the data processor 50. For example, the waveform memory 42 outputs the stored signal waveform data to the signal switch 34 at a predetermined rate, based on an instruction (or read request) from the data processor 50. The signal waveform data output from the waveform memory 42 is a digital value that gradually changes with time, and is the data for generating a periodic signal in which changes are repeated at a predetermined period, such as triangular waves, sinusoidal waves, or the like, for example. The waveform memory 42 is an example of a digital value generator configured to generate a digital value that gradually changes.

The signal switch 34 connects the output of the waveform memory 42 to the input of the DAC 35 during the Φ0 evaluation mode for measuring the flux quantum Φ0. Hence, during the Φ0 evaluation mode, the signal waveform data (or digital value) read from the waveform memory 42 is output to the DAC 35.

During the normal measurement mode for measuring the biomagnetic field or the like of the test subject, the signal switch 34 connects the output of the digital integrator 33 to the input of the DAC 35. Hence, during the normal measurement mode, the voltage value (or digital value) integrated by the digital integrator 33 is output to the DAC 35. By providing the signal switch 34 in the digital FLL circuit 30A, the DAC 35, the voltage-to-current converter 36, and the feedback coil 37 may be used in common during both the Φ0 evaluation mode and the normal measurement mode. As a result, a circuit scale of the digital FLL circuit 30A can be reduced compared to a case where a circuit to be used is provided for each of the modes.

The switching of a signal path by the signal switch 34 may be performed by the data processor 50 based on an instruction from the operator of the magnetic field measuring apparatus 100A, or alternatively, the switching of the signal path may be performed manually. In addition, the magnetic field measuring apparatus 100A may include a signal generator that generates a digital signal having a predetermined waveform, in place of the waveform memory 42. The signal switch 34 is an example of a path switching device configured to connect the output of the digital integrator 33 or the output of the waveform memory 42 to the input of DAC 35.

The DAC 35 converts the voltage value (or digital signal) integrated by the digital integrator 33, or the signal waveform data output from the waveform memory 42, into a voltage, and outputs the converted voltage to the voltage-to-current converter 36. The voltage-to-current converter 36 converts the voltage received from the DAC 35 into a current, and outputs the converted current to the feedback coil 37.

The feedback coil 37 generates a magnetic field due to the current received from the voltage-to-current converter 36, and feeds back the generated magnetic field to the SQUID 10. In other words, the feedback coil 37 generates the magnetic field received by the SQUID 10, based on the current from the voltage-to-current converter 36. Accordingly, during the normal measurement mode, the voltage generated by the SQUID 10 can be maintained near the working point (or linear region) of the Φ-V characteristic, and a biomagnetic field signal can be obtained with a high accuracy.

The SQUID sensor circuit 20A illustrated in FIG. 1 generates a magnetic field signal data from the magnetic field measured by the SQUID 10, according to a flux-quanta counting (FQC) method. The FQC method resets the digital integrator 33 and redirects feedback, when a magnitude of the observed magnetic field signal reaches the flux quantum Φ0, so as to prevent saturation of the SQUID sensor circuit 20A. In addition, the magnetic field signal data, that is the amount of change in the magnetic field from the start of the observation, is calculated by combining the number of times the reset is performed and the amount of data that is fed back.

Hence, according to the FQC method, the magnetic field signal data corresponding to a plurality of flux quantums can be calculated, and a dynamic range of the digital FLL circuit 30A can be increased to a maximum counted value of the digital integrator 33. On the other hand, when the FQC method is not used, the dynamic range of the digital FLL circuit 30A is decreased, because the dynamic range is determined solely by the number of bits of the digital integrator 33.

The SQUID 10, the feedback coil 37, and the SQUID sensor circuit 20A illustrated in FIG. 1 correspond to one channel of the magnetic field measuring apparatus 100A. Although not particularly limited, the magnetic field measuring apparatus 100A has 128 channels or 256 channels, for example. The waveform memory 42 may be provided externally to the SQUID sensor circuit 20A, and in common to the plurality of digital FLL circuits 30A.

TABLE 1

|  | Magneto-spinograph (MSG) | Magneto-cardiograph (MCG) | Magneto-encephalograph (MEG) |
|---|---|---|---|
| Magnetic Sensitivity (T) | Several to tens of f | Tens of f to 100 p | 10 f to 10 p |
| Signal Band (Hz) | 100 to several k | 0 to 1k | 0(0.1) to several hundred |
| Number of Channels | To 128 | 1 to 32 to 128 | 128 to 306 |

Table 1 illustrates an example of the magnetic sensitivity, the signal band, and the number of channels required for the measurement of the biomagnetic field signals for each of the applications. As illustrated in Table 1, the magnetic sensitivity, the signal band, and the number of channels required for the measurement of the biomagnetic field differ when applied to the magnetospinograph (MSG), the magnetocardiograph (MCG), and the magnetoencephalograph (MEG), respectively. In recent years, the magnetic field measuring apparatus 100A is applied not only to the magnetocardiograph (MCG) and the magnetoencephalograph (MEG), but also popularly applied to the magnetospinograph (MSG). The magnetospinograph (MSG) inputs an external electrical stimulation, and measures the biomagnetic field induced by the electrical stimulation. In this case, an artifact (or noise) caused by the electrical stimulation affects the measurement results. Generally, since the artifact is larger than the biomagnetic field, a wide dynamic range is required.

In addition, in a vagus nerve stimulation (VNS) used in the treatment of epilepsy, for example, an electrical stimulation generator, such as a pulse generator or the like, is implanted in the body of the test subject, and the electrical stimulation is applied to the vagus nerve. Because the large artifact also occurs when measuring the biomagnetic field by the magnetoencephalograph (MEG) in a state where the electrical stimulation is applied to the vagus nerve, the wide dynamic range is required to measure the biomagnetic field.

FIG. 2A and FIG. 2B are diagrams for explaining an example in which the flux quantum $\Phi 0$ is measured by the magnetic field measuring apparatus 100A illustrated in FIG. 1. In other words, FIG. 2A and FIG. 2B illustrate operating waveforms for explaining the method of calculating the flux quantum $\Phi 0$ during the $\Phi 0$ evaluation mode of the magnetic field measuring apparatus 100A including the digital FLL circuit 30A. In order to ensure the accuracy of resetting the feedback by the digital integrator 33 illustrated in FIG. 1 and the accuracy of the calculation of the magnetic field signal data, it is necessary to accurately detect the flux quantum $\Phi 0$. For this reason, the mode of the magnetic field measuring apparatus 100A is switched to the $\Phi 0$ evaluation mode to measure the flux quantum $\Phi 0$.

An upper portion of FIG. 2A illustrates the waveform (triangular wave in this example) of the digital value input from the waveform memory 42 to the DAC 35, where the ordinate indicates the digital value, and the abscissa indicates the time. For example, in FIG. 2A, the digital data indicating the triangular wave having a period of 125 ms (frequency of 8 Hz) is input to the DAC 35, but digital data indicating waveforms having other periods may be input to the DAC 35. By inputting the periodically changing signal waveform data of the triangular wave or the like to the DAC 35, the measurement of the digital value indicating the flux quantum $\Phi 0$ can be repeated, and thus, it is possible to easily obtain an average of the measurement results of the flux quantum $\Phi 0$. As a result, a measurement time of the flux quantum $\Phi 0$ can be shortened, and a measurement error of the flux quantum $\Phi 0$ can be reduced. In the $\Phi 0$ evaluation mode, the digital integrator 33 does not perform an integration, and operates as a buffer. Accordingly, the output of the ADC 32 appears at the output of the digital integrator 33, and the data processor 50 calculates the digital value indicating the flux quantum $\Phi 0$, based on the digital value of the ADC 32 output from the digital integrator 33 via the data generator 41.

A lower portion of FIG. 2A indicates a time variation of the digital value output from the ADC 32 after the voltage output from the SQUID 10 based on the triangular wave is amplified by the amplifier 31 and converted by the ADC 32. In other words, the waveform in the lower portion of FIG. 2A indicates a change in the digital value output from the ADC 32, according to the voltage output from the SQUID 10 when the input to the DAC 35, indicated in the upper portion of FIG. 2A, changes with time. The waveform indicated in the lower portion of FIG. 2A corresponds to the voltage waveform output from the SQUID 10 when the triangular wave is input to the DAC 35. In FIG. 2A, the amount of change of the input value of the DAC 35, corresponding to one period (one period traversing an arbitrary value on the ordinate) of the output value of the ADC 32, indicates the flux quantum $\Phi 0$.

In FIG. 2A, when an imaginary line is drawn downward from an arbitrary point on the upper waveform, a point where the imaginary line intersects the lower waveform, indicates the output value of the ADC 32 with respect to the input value of the DAC 35. Although the ADC 32 may directly receive the output voltage of the SQUID 10, the ADC 32 preferably receives the output voltage of the SQUID 10 via the amplifier 31 because the amplitude of the voltage output from the SQUID 10 is small.

FIG. 2B illustrates the waveform by taking the output value of the ADC 32 along the ordinate, and the input value of the DAC 35 along the abscissa. This waveform indicates the $\Phi$-V characteristic of the SQUID 10. Since the abscissa of the lower waveform illustrated in FIG. 2A is the time base, in a region where the triangular wave input to the DAC 35 changes proportionally with respect to the time, the output waveform of the ADC 32 becomes a waveform corresponding to the $\Phi$-V characteristic. In addition, when a switching between an increase and a decrease occurs near a vertex of the triangular wave, the output waveform of the ADC 32 folds back.

As illustrated in FIG. 2A, the flux quantum $\Phi 0$ is measured by inputting a waveform having a period greater than that of the flux quantum $\Phi 0$ to the SQUID 10, in a state where the digital FLL circuit 30A is not locked. In this case, the frequency of the triangular wave is preferably set sufficiently lower than the sampling frequency of the ADC 32 (for example, by 1/100 or less). For example, the frequency of the triangular wave is set to 1/100 the sampling frequency of the ADC 32. Accordingly, a periodic signal (the output voltage of the SQUID 10), that changes smoothly and has a small quantization error, can be output from the ADC 32, and thus, it is possible to improve the measurement accuracy of the digital value indicating the flux quantum $\Phi 0$.

In FIG. 2A, the amplitude (DINmin–DINmax) of the triangular wave is the amplitude at which the period of the voltage output from SQUID 10 in correspondence with the flux quantum $\Phi 0$ appears two times during a half-period (duration of a rising time or duration of a falling time) of the triangular wave. In other words, the amplitude of the triangular wave is the amplitude at which the period of the digital value, indicating the flux quantum $\Phi 0$ output from the ADC 32 based on the voltage output from the SQUID 10, appears at least once. That is, the amplitude of the triangular wave is set to a magnitude such that the ADC 32 can output a digital value corresponding to at least one flux quantum $\Phi 0$. Hence, it is possible to positively calculate the period of the digital value indicating the flux quantum $\Phi 0$ in the duration of the rising time or the duration of the falling time of the triangular wave.

The waveform input to the SQUID 10 is not limited to the triangular wave, and may be any waveform whose value gradually changes with time, such as a sinusoidal wave or the like. However, in a case where the sinusoidal wave is input to the DAC 35, the output waveform of the ADC 32 becomes a distorted waveform, because the input is not proportional with respect to the time. The amplitude and the peak of the flux quantum $\Phi 0$, output as the digital value, can be obtained accurately by using the triangular wave. In addition, compared to a case where the sinusoidal wave is generated, the triangular wave can simplify the circuit that generates the digital value, and reduce the number of data.

As described above, during the $\Phi 0$ evaluation mode, the signal switch 34 transfers the output of the waveform memory 42 to the DAC 35. For this reason, the digital value indicating the triangular wave illustrated in FIG. 2A is also the data output from the waveform memory 42.

The DAC 35 converts the digital value indicating the triangular wave into the voltage, and outputs the converted voltage to the voltage-to-current converter 36. The DAC 35 operates as a voltage generator configured to generate a voltage that gradually changes based on a digital value that gradually changes. The voltage-to-current converter 36 converts the gradually changing voltage indicating the triangular wave into a gradually changing current, and outputs the converted current to the feedback coil 37. The feedback coil 37 converts the gradually changing current indicating the triangular wave into a magnetic field.

The SQUID 10 generates a voltage that changes with the flux quantum Φ0, according to a change in the magnetic field converted by the feedback coil 37. The voltage generated by the SQUID 10 is amplified by the amplifier 31, and converted into a digital value (the lower waveform illustrated in FIG. 2A) by the ADC 32. The ADC 32 outputs a digital value having a predetermined amplitude repeated with the flux quantum Φ0, while the magnetic field gradually becomes stronger, or the magnetic field gradually becomes weaker. The digital integrator 33 is not reset by the flux quantum Φ0 during the Φ0 evaluation mode. For this reason, the digital integrator 33 outputs the digital value output from the ADC 32, as it is, to the data processor 50 via the data generator 41.

The data processor 50 calculates the flux quantum Φ0, based on the digital value received from the digital integrator 33. For example, the flux quantum Φ0 is calculated from a cross point interval of the digital value that has the predetermined amplitude and is output from the ADC 32. For example, in the lower waveform in FIG. 2A, a point where the digital value that decreases intersects "0" on the ordinate is regarded as the cross point, and the input value of the DAC 35, corresponding to the digital value between two mutually adjacent cross points, is calculated as the flux quantum Φ0. The mutually adjacent cross points may be set to points where the digital value that decreases intersects "0" on the ordinate, or intersects an arbitrary value on the ordinate.

Since a least significant bit of the digital value output from the ADC 32 is set to be the same as a least significant bit of the digital value input to the DAC 35, both the digital values indicate the same value (or voltage value). For example, an input voltage range (or full scale voltage) of ADC 32 is set to be the same as an output voltage range (or full scale voltage) of DAC 35. In a case where the number of bits of the ADC 32 and the number of bits of the DAC 35 are the same, the voltage value of the least significant bit of the digital value output from the ADC 32 is the same as the voltage value of the least significant bit of the digital value input to the DAC 35. For example, in a case where the full scale voltages of the ADC 32 and the DAC 35 are the same, and the number of bits of the DAC 35 is larger than the number of bits of the ADC 32, a scaling may be performed by an amount corresponding to the difference between the number of bits.

In a case where conversion characteristics of the ADC 32 and the DAC 35 are the same, the flux quantum Φ0 (corresponding value input to the DAC 35) calculated by the method illustrated in FIG. 2A and FIG. 2B is equal to the flux quantum Φ0 indicated by the digital value output from the ADC 32. In addition, the digital value indicating the flux quantum Φ0, calculated for each digital FLL circuit 30A, becomes different according to the variation in the individual electrical characteristics of the SQUID 10, the amplifier 31, and the ADC 32. Accordingly, the flux quantum Φ0 calculated during the Φ0 evaluation mode indicates a true flux quantum Φ0 that is corrected according to the variation in the individual electrical characteristics of the SQUID 10, the amplifier 31, and the ADC 32.

Therefore, during the normal measurement mode, the digital integrator 33 can accurately count the number of periodic changes in the Φ-V characteristic of the SQUID 10, using the digital value indicating the true flux quantum Φ0 that is calculated. For example, the digital integrator 33 resets the integrated value (or the digital value) when an increase in the integrated value reaches the digital value indicating the calculated flux quantum Φ0. As a result, the magnetic field measuring apparatus 100A can reduce the measurement error, even when measuring a large change in magnetic field exceeding one period of the flux quantum Φ0. In contrast, if the flux quantum Φ0 includes an error, the measurement error of the magnetic field will become large. For example, in the measurement of a magnetic field in which the number of flux quantums Φ0 is tens or more, the error is accumulated and multiplied by the tens.

Since the ADC 32 includes a quantization error, the flux quantum Φ0 that is calculated based on the cross point interval includes an errors corresponding to the quantization error. In addition, errors also occur depending on the measurement accuracy of the waveform, such as a fluctuation of the magnetic field (external noise, such as the artifact or the like), a deviation from the cross point due to the sampling period of the ADC 32, or the like. In this embodiment, the flux quantum Φ0 is measured a plurality of times and averaged, to minimize the error. In this case, as described above, by inputting the periodically changing signal waveform data, such as the triangular wave or the like, to the DAC 35, the measurement of the digital value indicating the flux quantum Φ0 can be repeated, to facilitate the measurement. By averaging N measurements, the effect of the error can be reduced to 1/SQRT(N), where SQRT denotes a square root.

Further, as illustrated in FIG. 2A, since the lower waveform indicating the flux quantum Φ0 folds back at the vertex of the triangular wave, the flux quantum Φ0 is calculated using a region (or an area) that avoids the folding point. For this reason, the calculating device that calculates the flux quantum Φ0 preferably calculates the period by making a correspondence between the digital value output from the ADC 32 and the triangular wave.

The magnetic field measuring apparatus 100A illustrated in FIG. 1 does not necessarily have to include the data processor 50. In this case, during the Φ0 evaluation mode, a calculating device (not illustrated) in the data generator 41 or the SQUID sensor circuit 20A calculates the flux quantum Φ0, based on the digital value output from the ADC 32.

Accordingly, in the first embodiment, the magnetic field is generated using the current converted from the gradually changing voltage, and calculating the digital value indicating the flux quantum Φ0 based on the digital value output from the ADC 32 that converts the periodically changing voltage output from the SQUID 10 that receives the generated magnetic field. Hence, it is possible to accurately calculate the flux quantum Φ0 of the digital value according to the variation in the electrical characteristics of the digital FLL circuit 30A. Further, by calculating the accurate flux quantum Φ0, it is possible to improve the accuracy of the working point control of the digital FLL circuit 30A. As a result, the accuracy of the magnetic field measurement by the FQC method with the wide dynamic range can be improved compared to the case where the flux quantum Φ0 is not calculated according to the variation in the individual conversion characteristic of the ADC 32.

By providing the signal switch 34 in the digital FLL circuit 30A, the digital value output from the digital integrator 33 or the digital value output from the waveform memory 42 may be used to operate the DAC 35, the voltage-to-current converter 36, and the feedback coil 37. In other words, the DAC 35, the voltage-to-current converter 36, and the feedback coil 37 may be used in common during both the Φ0 evaluation mode and the normal measurement mode. As a result, it is possible to reduce the circuit scale of the digital FLL circuit 30A having the Φ0 evaluation mode.

By making the frequency of the triangular wave sufficiently lower than the sampling frequency of the ADC 32, the digital value output from the ADC 32 and indicating the flux quantum Φ0 can be made to change smoothly, thereby improving the measurement accuracy of the flux quantum Φ0. In addition, by setting the amplitude of the triangular wave to the amplitude at which the period of the voltage output from the SQUID 10 in correspondence with the flux quantum Φ0 appears at least once, it is possible to generate the digital value corresponding to one period or more of the flux quantum Φ0 during the half-period of the triangular wave. As a result, it is possible to positively calculate the period of the digital value indicating the flux quantum Φ0.

The calculation error of the flux quantum Φ0 can be minimized by performing the measurement of the flux quantum Φ0 a plurality of times, and averaging the measurements. In this case, by inputting the periodically changing signal waveform data, such as the triangular wave or the like, to the DAC 35, the measurement of the digital value indicating the flux quantum Φ0 can be repeated, to facilitate the measurement.

During the normal measurement mode, the digital integrator 33 resets the integrated value (or the digital value) when the increase in the integrated value reaches the digital value (or counted value) indicating the flux quantum Φ0 calculated during the Φ0 evaluation mode. Hence, the magnetic field measuring apparatus 100A can measure the magnetic field with the reduced the measurement error, even when measuring the large change in magnetic field exceeding one period of the flux quantum Φ0.

Second Embodiment

Figure 3:
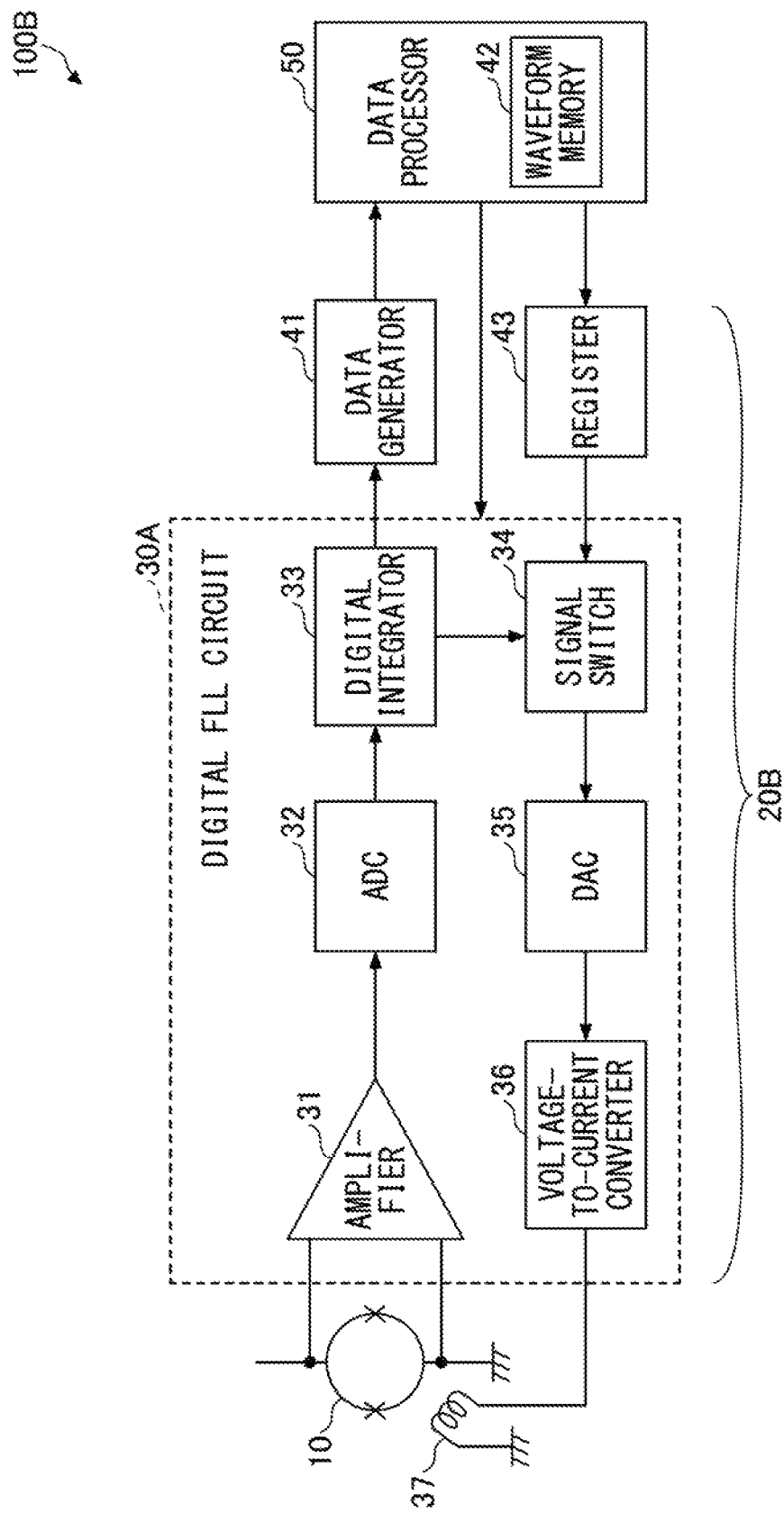
FIG. 3 is a block diagram illustrating an example of the magnetic field measuring apparatus according to a second embodiment of the present invention.

FIG. 3 is a block diagram illustrating an example of the magnetic field measuring apparatus according to a second embodiment of the present invention. In FIG. 3, constituent elements similar to those illustrated in FIG. 1 are designated by the same numerals, and the detailed description thereof be omitted. A magnetic field measuring apparatus 100B illustrated in FIG. 3 includes a SQUID sensor circuit 20B in place of the SQUID sensor circuit 20A illustrated in FIG. 1. The SQUID sensor circuit 20B includes a digital FLL circuit 30A similar to that illustrated in FIG. 1, a data generator 41, and a register 43.

In other words, the magnetic field measuring apparatus 100B includes the register 43 in place of the waveform memory 42 of the magnetic field measuring apparatus 100A illustrated in FIG. 1. In FIG. 3, the waveform memory 42 is formed using an internal memory of the data processor 50.

The register 43 temporarily stores the signal waveform data (or digital value) output from the waveform memory 42 of the data processor 50, and outputs the stored signal waveform data to the signal switch 34 in accordance with the timing of the triangular wave or the like illustrated in FIG. 2A. Hence, the data output timing (or output rate) from the waveform memory 42 does not need to be matched to that of the waveform input to the DAC 35, and the read access to the waveform memory 42 can be made at a predetermined rate determined by the data processor 50.

The operation of the digital FLL circuit 30A that calculates the flux quantum Φ0 during the Φ0 evaluation mode is similar to the operation described above in conjunction with FIG. 1, FIG. 2A, and FIG. 2B.

As described above, the effects similar to those obtainable in the first embodiment can also be obtained in the second embodiment. For example, the flux quantum Φ0 of the digital value can be accurately calculated in accordance with the variation in the electrical characteristics of the digital FLL circuit 30A. Further, it is possible to improve the accuracy of the working point control of the digital FLL circuit 30A, based on the flux quantum Φ0 that is accurately calculated. As a result, the accuracy of the magnetic field measurement by the FQC method with the wide dynamic range can be improved.

Third Embodiment

Figure 4:
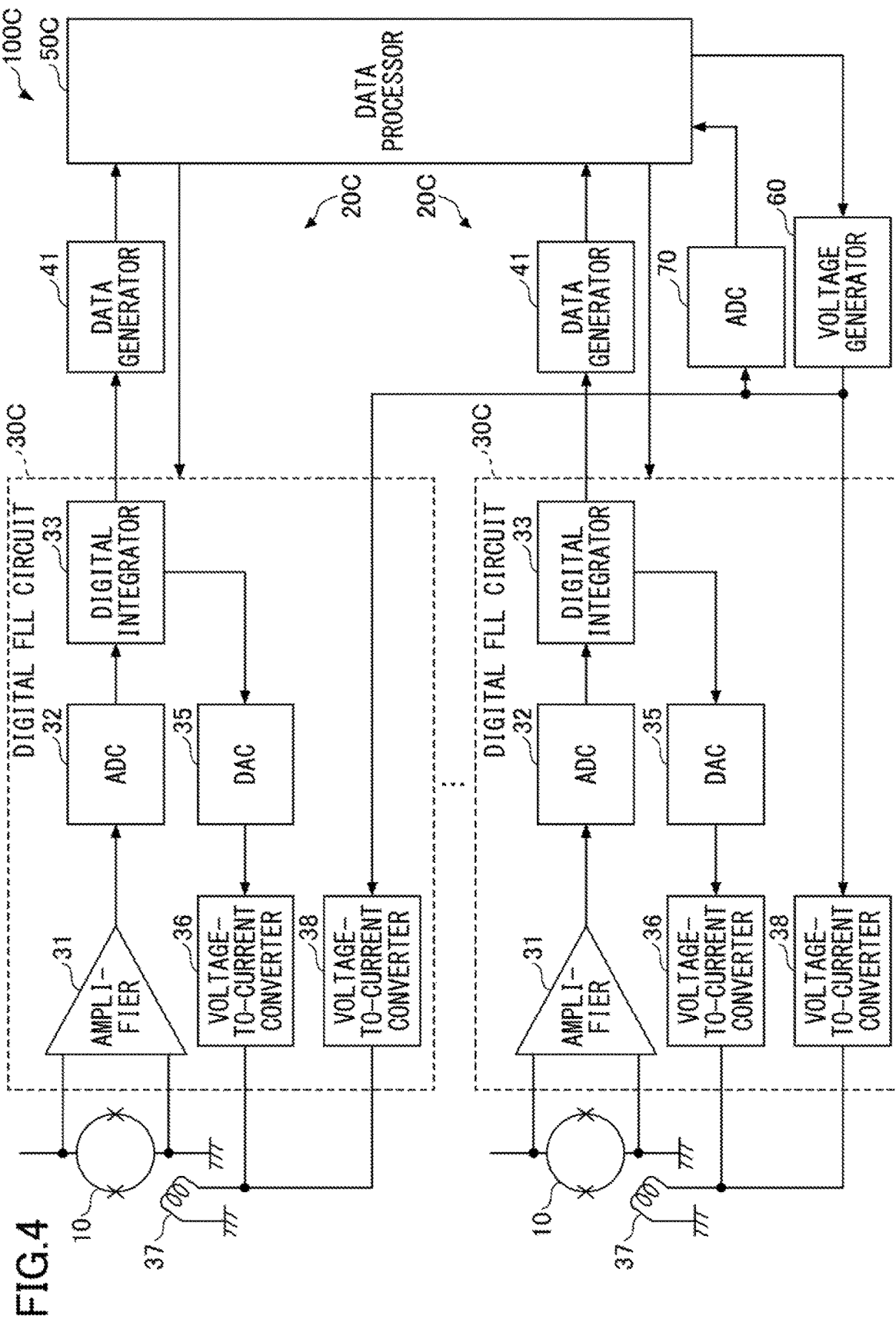
FIG. 4 is a block diagram illustrating an example of the magnetic field measuring apparatus according to a third embodiment of the present invention.

FIG. 4 is a block diagram illustrating an example of the magnetic field measuring apparatus according to a third embodiment of the present invention. In FIG. 4, constituent elements similar to those illustrated in FIG. 1 are designated by the same numerals, and the detailed description thereof be omitted. A magnetic field measuring apparatus 100C illustrated in FIG. 4 includes a SQUID sensor circuit 20C in place of the SQUID sensor circuit 20A illustrated in FIG. 1, and includes a data processor 50C in place of the data processor 50 illustrated in FIG. 1. The data processor 50C is an example of the calculating device that calculates a digital value indicating the flux quantum Φ0.

The SQUID sensor circuit 20C is similar to the SQUID sensor circuit 20A illustrated in FIG. 1, except that the SQUID sensor circuit 20C includes a digital FLL circuit 30C in place of the digital FLL circuit 30A illustrated in FIG. 1. The magnetic field measuring apparatus 100C also includes a voltage generator 60 and an ADC 70 that are provided in common to a plurality of digital FLL circuits 30C. For example, the voltage generator 60 and the ADC 70 are mounted on one of a plurality of circuit boards mounted with a plurality of SQUID sensor circuits 20C.

An output of the voltage generator 60 is connected to an input of the ADC 70, and to an input of a voltage-to-current converter 38 of each of the digital FLL circuits 30C. The voltage generator 60 generates a voltage based on a control of the data processor 50C. The voltage generator 60 may be provided externally to the magnetic field measuring apparatus 100C. In this case, the circuit board mounted with the ADC 70 is provided with external terminals for receiving the voltage from the external voltage generator 60.

Although not particularly limited, the magnetic field measuring apparatus 100C includes 128 sets or 256 sets of SQUIDs 10, feedback coils 37, and SQUID sensor circuits 20C, for example. In other words, the magnetic field measuring apparatus 100C has 128 or 256 channels.

The digital FLL circuit 30C has a structure similar to that of the digital FLL circuit 30A illustrated in FIG. 1, except that the voltage-to-current converter 38 is additionally provided in the digital FLL circuit 30C. The voltage-to-current converter 38 converts the gradually changing voltage generated by the voltage generator 60 to a current during the Φ0 evaluation mode, and during an advance evaluation mode prior to performing the operation in the Φ0 evaluation mode, and outputs the converted current to the feedback coil 37.

During the advance evaluation mode, the data processor 50C causes the voltage generator 60 to output a voltage in a state where each digital FLL circuit 30C is locked, similar to the normal measurement mode, and accumulates the digital values output from the ADC 70 and each ADC 32. In addition, the data processor 50C calculates a conversion coefficient between the voltage from the voltage generator 60 and the feedback voltage from the amplifier 31, for each of the digital FLL circuits 30C, based on the digital values output from the ADC 70 and each of the ADCs 32.

After calculating the conversion coefficient during the advance evaluation mode, the data processor 50C causes the voltage generator 60 to generate the gradually changing voltage, such as the triangular wave, the sinusoidal wave, or the like during the Φ0 evaluation mode, and outputs the generated voltage to each of the voltage-to-current converters 38. In addition, the data processor 50C receives the periodic waveform of the digital value indicating the flux quantum Φ0 from the digital integrator 33 via the data generator 41, from each of the digital FLL circuits 30C, and corrects the waveform using the conversion coefficient calculated during the advance evaluation mode, to calculate the digital value indicating the flux quantum Φ0. The method of calculating the digital value indicating the flux quantum Φ0 is the same as the method described above in conjunction with FIG. 2A, except that a correction is made using the conversion coefficient.

In this embodiment, the voltage generated by the voltage generator 60 is simultaneously supplied to the plurality of digital FLL circuits 30C, to generate a voltage by each of the SQUIDs 10. For this reason, the output waveform of the ADC 32 illustrated in the lower portion of FIG. 2A can be obtained for each of the digital FLL circuits 30C without individually controlling the digital FLL circuits 30C. In this case, the conversion coefficient between the voltage from the voltage generator 60 and the feedback voltage from the amplifier 31, can be calculated for each of the digital FLL circuits 30C, using the ADC 70. Accordingly, by generating the voltage from the voltage generator 60 for a predetermined number of periods, the flux quantum Φ0 (or digital value) can be calculated for each of the digital FLL circuits 30C, regardless of the number of channels of the digital FLL circuits 30C.

As described above, the third embodiment can also calculate the flux quantum Φ0 of the digital value in accordance with the variation in the electrical characteristics of the digital FLL circuits 30C, similar to the above described embodiments. Accordingly, it is possible to improve the accuracy of the working point control of the digital FLL circuits 30C, and improve the accuracy of the magnetic field measurement by the FQC method with the wide dynamic range.

Further, in the third embodiment, by generating the voltage that is common to the plurality of digital FLL circuits 30C by the voltage generator 60, the flux quantum Φ0 can be calculated for each of the digital FLL circuits 30C, without having to individually control the digital FLL circuits 30C. Accordingly, by generating the voltage by the voltage generator 60, regardless of the number of channels of the digital FLL circuits 30C, the flux quantum Φ0 (or digital value) can be calculated for each of the digital FLL circuits 30C. By providing the ADC 70, the conversion coefficient between the voltage from the voltage generator 60 and the feedback voltage from the amplifier 31, can be calculated for each of the digital FLL circuits 30C, and an accurate flux quantum Φ0 can be calculated.

Fourth Embodiment

Figure 5:
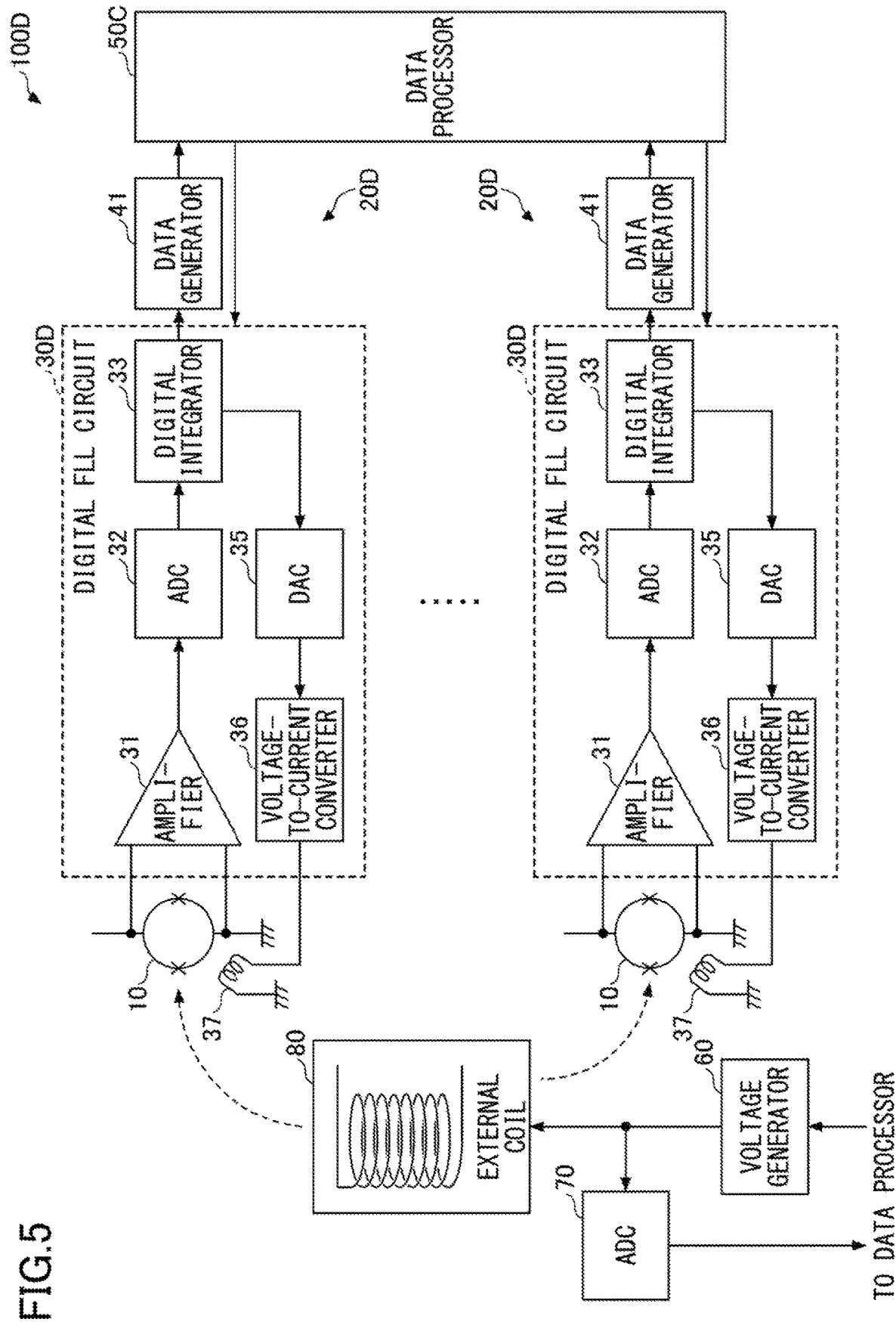
FIG. 5 is a block diagram illustrating an example of the magnetic field measuring apparatus according to a fourth embodiment of the present invention.

FIG. 5 is a block diagram illustrating an example of the magnetic field measuring apparatus according to a fourth embodiment of the present invention. In FIG. 5, constituent elements similar to those illustrated in FIG. 1 and FIG. 4 are designated by the same numerals, and the detailed description thereof be omitted. A magnetic field measuring apparatus 100D illustrated in FIG. 5 includes a SQUID sensor circuit 20D in place of the SQUID sensor circuit 20A illustrated in FIG. 1. The SQUID sensor circuit 20D includes a digital FLL circuit 30D, and a data generator 41.

The magnetic field measuring apparatus 100D also includes a voltage generator 60, an ADC 70, and an external coil 80 that are common to a plurality of digital FLL circuits 30D. For example, the voltage generator 60 and the ADC 70 are mounted on one of a plurality of circuit boards mounted with a plurality of SQUIDs 10 and a plurality of feedback coils 37. The output of the voltage generator 60 is connected to the input of the ADC 70, and to the external coil 80. Similar to FIG. 4, the voltage generator 60 generates a voltage based on the control of the data processor 50C. The voltage generator 60 may be provided externally to the magnetic field measuring apparatus 100D. In this case, the circuit board mounted with the ADC 70 is mounted is provided with external terminals for receiving the voltage from the external voltage generator 60.

The external coil 80 is preferably arranged so that the magnetic flux densities of the magnetic fields received by the plurality of SQUIDs 10 from the outer coil 80 are approximately the same. For this reason, the external coil 80 is arranged at a position that is slightly separated from each of the SQUIDs 10 by the same distance from each of the SQUIDs 10, for example. It is necessary to increase the magnetic field generated by the external coil 80 as the position of the external coil 80 becomes more separated from the SQUIDs 10.

The digital FLL circuit 30D has a configuration in which the signal switch 34 is omitted from the digital FLL circuit 30A illustrated in FIG. 1, and the integrated value output from the digital integrator 33 is input directly to the DAC 35. Although not particularly limited, the magnetic field measuring apparatus 100D includes 128 sets or 256 sets of SQUIDs 10, the feedback coil 37, and the SQUID sensor circuit 20D, for example. In other words, the magnetic field measuring apparatus 100D includes 128 or 256 channels.

The digital FLL circuit 30D in this embodiment does not include the signal switch 34 illustrated in FIG. 1 and FIG. 3, nor the voltage-to-current converter 38 illustrated in FIG. 4. For this reason, the circuit scale of the digital FLL circuit 30D can be reduced, and the device cost of the magnetic field measuring apparatus 100D can be reduced. The effect of reducing device cost of the magnetic field measuring apparatus 100D becomes larger as the number of devices mounted on the magnetic field measuring apparatus 100D increases depending on the number of channels.

Similar to FIG. 4, during the advance evaluation mode, the data processor 50C causes the voltage generator 60 to generate the gradually changing voltage in a state where each digital FLL circuit 30D is locked, similar to the normal measurement mode. The ADC 70 converts the voltage from the voltage generator 60 into a digital value, and outputs the converted voltage to the data processor 50C.

The external coil 80 generates a magnetic field according to the voltage from the voltage generator 60. Each SQUID 10 generates a voltage based on the magnetic field generated by the external coil 80. The voltage generated by each SQUID 10 is converted into a digital value by the corresponding ADC 32. In addition, the data processor 50C accumulates the digital values output from the ADC 70 and each of the ADCs 32. Similar to FIG. 4, the data processor 50C calculates the conversion coefficient between the voltage from the voltage generator 60 and the feedback voltage from the amplifier 31, for each of the digital FLL circuits 30D, based on the digital values output from the ADC 70 and each of the ADCs 32.

After calculating the conversion coefficient during the advance evaluation mode, the data processor 50C causes the voltage generator 60 to generate the gradually changing voltage, such as the triangular wave, the sinusoidal wave, or the like, during the Φ0 evaluation mode. The external coil 80 generates the magnetic field according to the voltage from the voltage generator 60. Each SQUID 10 generates the voltage based on the magnetic field generated by the external coil 80, and the generated voltage is converted into the digital value by the corresponding ADC 32.

The data processor 50C receives the periodic waveform of the digital value indicating the flux quantum Φ0 from the digital integrator 33, corrects the waveform using the conversion coefficient obtained in advance, and calculates the digital value indicating the flux quantum Φ0, similar to FIG. 4. The method of calculating the digital value indicating the flux quantum Φ0 is the same as the method described above in conjunction with FIG. 2A and FIG. 2B, except that the correction is made using the conversion coefficient.

Accordingly, the fourth embodiment can also calculate the flux quantum Φ0 (or the output value of the ADC 32) in accordance with the variation in the electrical characteristics of the digital FLL circuits 30D, similar to the embodiments described above. Hence, it is possible to improve the accuracy of the working point control of the digital FLL circuits 30D, and improve the accuracy of the magnetic field measurement by the FQC method with the wide dynamic range.

Moreover, similar to the third embodiment, by generating the voltage that is common to the plurality of digital FLL circuits 30D by the voltage generator 60, the flux quantum Φ0 can be calculated for each of the digital FLL circuits 30D without individually controlling the digital FLL circuits 30D. Therefore, by generating the voltage by the voltage generator 60 regardless of the number of channels of the digital FLL circuits 30D, the flux quantum Φ0 (or digital value) can be calculated for each of the digital FLL circuits 30D.

Further, in the fourth embodiment, since the digital FLL circuit 30D does not include the signal switch 34 nor the voltage-to-current converter 38, the circuit scale of the digital FLL circuit 30D can be reduced, and the device cost of the magnetic field measuring apparatus 100D can be reduced.

Although the present disclosure is described heretofore based on the embodiments, the present disclosure is not limited to the described embodiments, and various variations, modifications, and substitutions may be made without departing from the scope of the present disclosure.

Although the embodiments are numbered with, for example, "first," "second," "third," or "fourth," the ordinal numbers do not imply priorities of the embodiments. Many other variations and modifications will be apparent to those skilled in the art.

What is claimed is:

1. A magnetic field measuring apparatus, comprising:
    a digital flux locked loop circuit including
        a first analog-to-digital converter configured to convert a periodically changing voltage, output from a superconducting quantum interference device according to a change in a magnetic field, into a digital value,
        a digital integrator configured to integrate the digital value output from the first analog-to-digital converter,
        a digital-to-analog converter configured to convert an integrated value output from the digital integrator into a voltage,
        a first voltage-to-current converter configured to convert the voltage output from the digital-to-analog converter into a current, and
        a first coil configured to generate the magnetic field received by the superconducting quantum interference device, based on the current output from the first voltage-to-current converter; and
    a calculating device configured to calculate a digital value indicating a flux quantum based on the digital value output from the first analog-to-digital converter when the first analog-to-digital converter converts the periodically changing voltage output from the superconducting quantum interference device upon receiving the magnetic field generated by a current that is obtained by converting a voltage generated by a voltage generator.

2. The magnetic field measuring apparatus as claimed in claim 1, further comprising:
    a digital value generator configured to generate a digital value that changes gradually; and
    a path switch configured to couple an output of the digital integrator or the digital value generator to an input of the digital-to-analog converter,
    wherein, when the path switch couples the output of the digital value generator to the input of the digital-to-analog converter,
        the digital-to-analog converter operates as the voltage generator that generates the gradually changing voltage based on the gradually changing digital value received from the digital value generator,
        the first voltage-to-current converter converts the gradually changing voltage into a gradually changing current, and
        the first coil generates the magnetic field using the gradually changing current,
    wherein the calculating device calculates the flux quantum using the digital value, that is obtained by converting the voltage output from the superconducting quantum interference device according to the magnetic field generated by the first coil by the first analog-to-digital converter, and is received via the digital integrator.

3. The magnetic field measuring apparatus as claimed in claim 2, wherein the path switch
    couples the output of the digital value generator to the input of the digital-to-analog converter during an evaluation mode for obtaining the digital value indicating the flux quantum, and
    couples the output of the digital integrator to the input of the digital-to-analog converter when measuring the magnetic field by the digital flux locked loop circuit using the digital value calculated by the calculating device.

4. The magnetic field measuring apparatus as claimed in claim 3, wherein the digital integrator resets the integrated value when an increase in the integrated value reaches a digital value indicating the flux quantum calculated by the calculating device.

5. The magnetic field measuring apparatus as claimed in claim 2, wherein
    the digital value generator generates the digital value indicating a waveform having a frequency lower than a sampling frequency of the first analog-to-digital converter, and the waveform has an amplitude including at least one period of the voltage output from the superconducting quantum interference device during a half-period of the waveform.

6. The magnetic field measuring apparatus as claimed in claim 5, wherein the digital integrator resets the integrated value when an increase in the integrated value reaches a digital value indicating the flux quantum calculated by the calculating device.

7. The magnetic field measuring apparatus as claimed in claim 2, wherein the digital value generator generates the digital value indicating a triangular wave or a sinusoidal wave.

8. The magnetic field measuring apparatus as claimed in claim 7, wherein the digital integrator resets the integrated value when an increase in the integrated value reaches a digital value indicating the flux quantum calculated by the calculating device.

9. The magnetic field measuring apparatus as claimed in claim 1, further comprising:
 a plurality of digital flux locked loop circuits, including the digital flux locked loop circuit, provided in correspondence with each of a plurality of superconducting quantum interference devices including the superconducting quantum interference device; and
 a second analog-to-digital converter configured to convert the voltage generated by the voltage generator into a digital value,
 wherein each of the plurality of digital flux locked loop circuits includes a second voltage-to-current converter configured to convert the voltage generated by the voltage generator into a current,
 the first coil of each of the plurality of the digital flux locked loop circuits generates the magnetic field based on the current output from the second voltage-to-current converter, and
 the calculating device calculates the digital value indicating the flux quantum for each of the plurality of the digital flux locked loop circuits, based on the digital value output from the first analog-to-digital converter that converts the voltage output from the superconducting quantum interference device upon receiving the magnetic field generated by the first coil based on the current from the second voltage-to-current converter, and the digital value output from the second analog-to-digital converter.

10. The magnetic field measuring apparatus as claimed in claim 9, wherein the digital integrator resets the integrated value when an increase in the integrated value reaches a digital value indicating the flux quantum calculated by the calculating device.

11. The magnetic field measuring apparatus as claimed in claim 1, further comprising:
 a plurality of digital flux locked loop circuits, including the digital flux locked loop circuit, provided in correspondence with each of a plurality of superconducting quantum interference devices including the superconducting quantum interference device;
 a second analog-to-digital converter configured to convert the voltage generated by the voltage generator into a digital value; and
 a second coil configured to generate a magnetic field using the voltage generated by the voltage generator,
 wherein the calculating device calculates the digital value indicating the flux quantum for each of the plurality of the digital flux locked loop circuits, based on the digital value output from the first analog-to-digital converter that converts the voltage output from the superconducting quantum interference device upon receiving the magnetic field generated by the second coil, and the digital value output from the second analog-to-digital converter.

12. The magnetic field measuring apparatus as claimed in claim 11, wherein the digital integrator resets the integrated value when an increase in the integrated value reaches a digital value indicating the flux quantum calculated by the calculating device.

13. The magnetic field measuring apparatus as claimed in claim 1, wherein
 the first analog-to-digital converter converts the voltage output from the superconducting quantum interference device into the digital value corresponding to the gradually changing voltage generated by the voltage generator a plurality of times, and
 the calculating device calculates an average of a plurality of flux quantum values calculated based on a plurality of digital values output from the first analog-to-digital converter.

14. The magnetic field measuring apparatus as claimed in claim 13, wherein the digital integrator resets the integrated value when an increase in the integrated value reaches a digital value indicating the flux quantum calculated by the calculating device.

15. A flux quantum calculating method for calculating a flux quantum using a magnetic field measuring apparatus that includes a digital flux locked loop circuit, the flux quantum calculating method comprising:
 converting, by a first analog-to-digital converter included in the digital flux locked loop circuit, a periodically changing voltage, output from a superconducting quantum interference device according to a change in a magnetic field, into a digital value;
 integrating, by a digital integrator included in the digital flux locked loop circuit, the digital value output from the first analog-to-digital converter, into an integrated value;
 converting, by a first voltage-to-current converter included in the digital flux locked loop circuit, the integrated value output from the digital integrator, into a current;
 generating, by a first coil included in the digital flux locked loop circuit, the magnetic field received by the superconducting quantum interference device, based on the current output from the first voltage-to-current converter; and
 calculating, by a calculating device included in the magnetic field measuring apparatus, a digital value indicating a flux quantum based on the digital value output from the first analog-to-digital converter when the first analog-to-digital converter converts the periodically changing voltage output from the superconducting quantum interference device upon receiving the magnetic field generated by a current that is obtained by converting a voltage generated by a voltage generator.

16. The flux quantum calculating method as claimed in claim 15, further comprising:
 generating, by a digital value generator, a digital value that changes gradually; and
 coupling, by a path switch, an output of the digital integrator or the digital value generator to an input of a digital-to-analog converter included in the digital flux locked loop circuit, wherein, when the coupling couples the output of the digital value generator to the input of the digital-to-analog converter, the coupling includes
operating the digital-to-analog converter as the voltage generator that generates the gradually changing voltage based on the gradually changing digital value received from the digital value generator,
converting the gradually changing voltage into a gradually changing current by the first voltage-to-current converter, and
generating the magnetic field by the first coil using the gradually changing current,
wherein the calculating calculates the flux quantum as the digital value output by the first analog-to-digital converter, using the digital value output from the digital integrator based on the voltage output from the superconducting quantum interference device according to the magnetic field generated by the first coil.

17. The flux quantum calculating method as claimed in claim 16, wherein the coupling includes
coupling the output of the digital value generator to the input of the digital-to-analog converter during an evaluation mode for obtaining the digital value indicating the flux quantum, and
coupling the output of the digital integrator to the input of the digital-to-analog converter when measuring the magnetic field by the digital flux locked loop circuit using the digital value calculated by the calculating.

18. The flux quantum calculating method as claimed in claim 16, wherein
the generating the digital value by the digital value generator generates the digital value indicating a waveform having a frequency lower than a sampling frequency of the first analog-to-digital converter, and
the waveform has an amplitude including at least one period of the voltage output from the superconducting quantum interference device during a half-period of the waveform.

19. The flux quantum calculating method as claimed in claim 15, further comprising:
providing a plurality of digital flux locked loop circuits, including the digital flux locked loop circuit, in correspondence with each of a plurality of superconducting quantum interference devices including the superconducting quantum interference device;
converting, by a second analog-to-digital converter, the voltage generated by the voltage generator into a digital value; and
converting the voltage generated by the voltage generator into a current by a second voltage-to-current converter included in each of the plurality of digital flux locked loop circuits,
wherein the generating generates the magnetic field by the first coil of each of the plurality of the digital flux locked loop circuits, based on the current output from the second voltage-to-current converter, and
wherein the calculating calculates the digital value indicating the flux quantum for each of the plurality of the digital flux locked loop circuits, based on the digital value output from the first analog-to-digital converter that converts the voltage output from the superconducting quantum interference device upon receiving the magnetic field generated by the first coil based on the current from the second voltage-to-current converter, and the digital value output from the second analog-to-digital converter.

20. The flux quantum calculating method as claimed in claim 15, further comprising:
providing a plurality of digital flux locked loop circuits, including the digital flux locked loop circuit, in correspondence with each of a plurality of superconducting quantum interference devices including the superconducting quantum interference device;
converting, by a second analog-to-digital converter, the voltage generated by the voltage generator into a digital value; and
generating, by a second coil, a magnetic field using the voltage generated by the voltage generator,
wherein the calculating calculates the digital value indicating the flux quantum for each of the plurality of the digital flux locked loop circuits, based on the digital value output from the first analog-to-digital converter that converts the voltage output from the superconducting quantum interference device upon receiving the magnetic field generated by the second coil, and the digital value output from the second analog-to-digital converter.

\* \* \* \* \*